United States Patent [19]
Logie et al.

[11] Patent Number: 6,064,595
[45] Date of Patent: May 16, 2000

[54] FLOATING GATE MEMORY APPARATUS AND METHOD FOR SELECTED PROGRAMMING THEREOF

[75] Inventors: Stewart G. Logie, Campbell; Sunil D. Mehta, San Jose; Steven J. Fong, Santa Clara, all of Calif.

[73] Assignee: Vantis Corporation, Sunnyvale, Calif.

[21] Appl. No.: 09/220,201

[22] Filed: Dec. 23, 1998

[51] Int. Cl.$^7$ .................................................. G11C 13/00
[52] U.S. Cl. .............................. 365/185.18; 365/185.17
[58] Field of Search .......................... 365/185.1, 185.17, 365/185.18, 189.01, 230.01

[56] References Cited

U.S. PATENT DOCUMENTS

| | | | |
|---|---|---|---|
| 4,924,278 | 5/1990 | Logie | 357/23.5 |
| 5,170,373 | 12/1992 | Doyle | 365/185.17 |
| 5,491,657 | 2/1996 | Haddad et al. | 365/185.27 |
| 5,742,542 | 4/1998 | Lin et al. | 365/185.08 |

OTHER PUBLICATIONS

"Performance Limitations of a Flash E$^2$PROM Cell, Programmed with Zener Induced Hot Electrons", by J. Ranaweera, I. Kalastirsky, A. Dibu–Caiole, W.T. Ng, and C.A.T. Salama, Proceedings of the 15th Annual Non–Volatile Semiconductor Memory Workshop, Paper #2.2 (1997).

*Primary Examiner*—Terrell W. Fears
*Attorney, Agent, or Firm*—Fliesler, Dubb, Meyer & Lovejoy LLP

[57] ABSTRACT

A method of creating a reverse breakdown condition in an array of memory cells arranged in columns and rows in the array, and an array structure are provided. The method comprises the steps of applying a first voltage on a first column connection coupling a first column of said cells, and a second voltage on a second column connection coupling a second column of said cells; and applying a third voltage on a first row connection coupling a first row of said cells, and applying said second voltage on a second row connection coupling a second row of said cells. In this aspect, the difference between the first voltage and the third voltage creates said reverse breakdown condition in at least one cell occupying said first column and first row. In a further aspect, each cell includes a floating gate and the method of the invention includes the step of programming one of said cells by coupling a control voltage to each floating gate. The structure includes a substrate having formed therein at least an Nth or Mth row-wise oriented well, each well isolated from adjacent ones of said wells. Also provided are at least an Nth and Mth word bit line formed by an Nth and Mth impurity regions in said substrate and at least an Nth and Mth array control gate lines. A plurality of memory cells, each cell formed in at least said Nth or Mth row-wise well, is further provided. Each cell comprises a drain, a floating gate, a drain connection one of said Nth or Mth word bit line (WBL), and a substrate well connection to one of said Nth or Mth wells, and a control gate connection to one of said Nth or Mth array control gate lines(ACG).

24 Claims, 10 Drawing Sheets

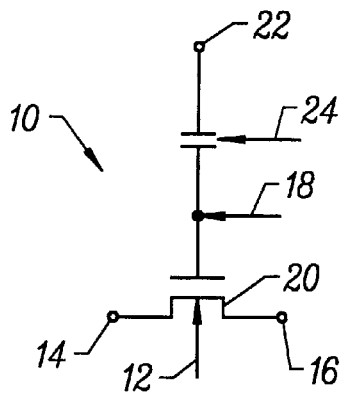
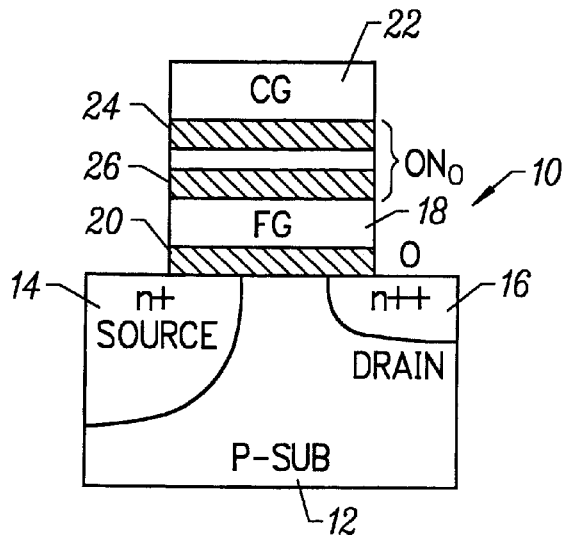
FIG. 2A
FIG. 2B
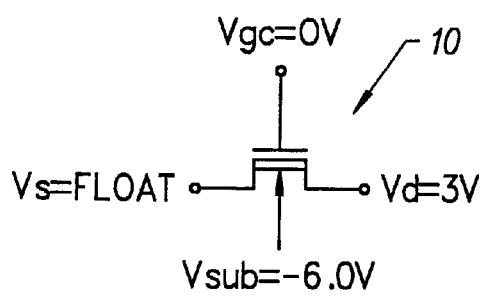
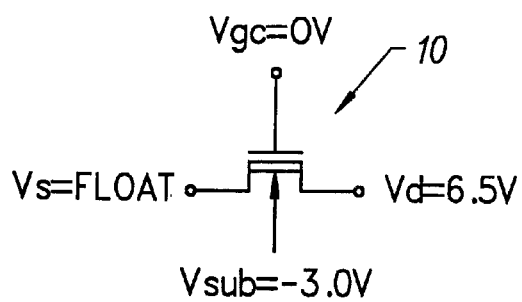
FIG. 3A
FIG. 3B

| Operation | ACG | BL | WL | WC | FG |
|---|---|---|---|---|---|
| Erase (bulk) | 0V | 8V | 0V | HiZ | -ve |
| Program | 8V | 8V | 0V | HiZ | -ve+$\Delta V_p$ |
| Not progr. | 0V | 8V | 0V | HiZ | -ve-$\Delta_p$ |
| Not progr. | 8V | 3.3V | 0V | HiZ | -ve |
| Read | 3.3V | ground | 3.3V | 3.3V | -ve(or+$\Delta V_p$) |

$\Delta_p$ = Programming disturb; it should be less than 1V.

$\Delta V_p$ = It will be in 3-8V range depending on programming time.
$\Delta V_p \cong 4V$ for $t_{prog} \cong 10 \mu s$.

*Assumed that the junction breakdown voltage is at 7.5V or below so that 8V operation is sufficient for junction breakdown.

*FIG. 4B*

FLOATING GATE MEMORY APPARATUS AND METHOD FOR SELECTED PROGRAMMING THEREOF

BACKGROUND OF THE INVENTION

1. Field of the Invention

The invention relates to nonvolatile memory, and particularly a method for programming and erasing, a nonvolatile memory array and a non-volatile memory array structure.

2. Description of the Related Art

Non-volatile memory devices of the type commonly referred to in the art as EPROM, EEPROM, or Flash EEPROM serve a variety of purposes, and are hence provided in a variety of architectures and circuit structures.

As with many types of integrated circuit devices, some of the main objectives of non-volatile memory device designers are to increase the performance of devices, while decreasing device dimensions and consequently increasing circuit density. Cell designers strive for designs which are reliable, scalable, cost effective to manufacture and able to operate at lower power, in order for manufacturers to compete in the semiconductor industry. EEPROM devices are one such device that must meet these challenges. In some applications, such as flash memory cards, density is at a premium, while in applications such as programmable logic devices (PLD's), reliability is more important and space is at less of a premium.

As process technology moves toward the so-called 0.18 and 0.13 micron processes, the conventional "stacked gate" EEPROM structure has given way to different cell designs and array architectures, all intended to increase density and reliability in the resulting circuit. In addition, designers strive to reduce power requirements of devices by reducing program and erase voltage requirements.

In the self-aligned, "stacked gate" cell, a high quality oxide is required, as well as a unique drain and source structure optimized for program and erase operations, respectively, and complementary adaptive program and erase algorithms. Typically, in the stacked gate EEPROM, in order to store a logical zero, electrons are injected onto the floating gate to provide a negative voltage on the floating gate thus increasing the control gate threshold voltage needed to turn on the transistor. Likewise, in order to erase the EEPROM, electrons are removed from the floating gate thereby decreasing the threshold voltage and a logical one is stored on the gate. While stacked gate embodiments have existed and worked well for some time, improved alternative cells have resulted in higher performance integrated circuit devices.

One example of an alternative to the stacked gate EEPROM structure is shown in U.S. Pat. No. 4,924,278, issued to Stewart Logie on May 8, 1990 and assigned to the assignee of the present invention. The EEPROM structure disclosed therein utilizes a single layer of polycrystalline silicon so as to eliminate the need to form a separate control gate and floating gate. The EEPROM structure shown therein is made up of three separate NMOS transistors: a write transistor, a read transistor, and a sense transistor. In order to "program" the floating gate, a net positive charge is placed on the gate by removing free electrons from the floating gate. Likewise, to erase the floating gate, the floating gate is given a net negative charge by injecting electrons onto the floating gate. This basic EEPROM structure has been well exploited in commercial devices. Nevertheless, as process technologies and practical considerations drive designers toward higher performance, alternative designs are investigated. For example, the aforementioned cell structure requires, in a number of embodiments, a minimum oxide thickness of about 90 Å for the program junction oxide region to prevent charge loss due to direct tunneling under the presence of the high electric field across this region.

An alternative to the aforementioned Fowler-Nordheim tunneling-based cell structure is presented in Ranaweera, et al., "Performance Limitations of a Flash EEPROM Cell, Programmed With Zener Induced Hot Electrons," University of Toronto Department of Electrical Engineering (1997). Discussed therein is a flash EEPROM cell which accomplishes programming and erase by establishing a reverse breakdown condition at the drain/substrate junction, generating hot electrons which are then injected into the floating gate to program the cell.

FIGS. 1A, 1B and 1C of Ranaweera, et al. are reproduced as FIGS. 1A, 1B and 1C of the present application. FIGS. 1B and 1C are cross-sections of the plan view of the cell shown in FIG. 1A. As shown in FIG. 1C, a "ZEEPROM" cell comprises a source and drain region, floating gate and control gate, with a P+pocket implant extending part way across the width of the drain region to generate hot electrons for programming. The flash ZEEPROM cells are fabricated using CMOS compatible process technology, with the addition of a heavily doped boron implant for the P+region replacing the LDD region. A sidewall spacer is necessary to form the self-aligned N+source and drain regions and to avoid counter-doping of the P+pocket.

To program the flash ZEEPROM cell, the PN junction is reverse-biased to create an electric field of approximately $10^6$ volt/cm. and generate energetic hot electrons independent of the channel length. The P+region adjacent to the drain enhances this generation. A low junction breakdown voltage can be used for programming by optimizing the PN junction depth and profiles. One disadvantage of this ZEEPROM is that a low drain voltage (approximately one volt) must be used to read the cell since the P+region exhibits a low breakdown voltage which can contribute to "soft programming" due to unwanted charge injection to the gate (generally also referred to herein as "program disturb"). Erasing in the cell is performed by Fowler-Nordheim tunneling of electrons from the floating gate to the source region using a negative gate voltage and supply voltage connected to the source similar to conventional flash EEPROM cells.

Another alternative cell structure using hot electron programming generated by a reverse breakdown condition at the drain is described in the context of a method for bulk charging and discharging of an array of flash EEPROM memory cells in U.S. Pat. No. 5,491,657 issued to Haddad, et al., assigned to the assignee of the present invention. In Haddad, et al., a cell structure similar to that shown in cross-section in FIG. 1B of the present application may be used, as well as a substrate-biased p-well in n-well embodiment. In the first embodiment, an N+source region includes an N+implant region and an N diffusion region, and the erase (removing electrons) operation is accomplished by applying (−)8.5 volts to the control gate for 100 milliseconds, and (+)5 volts to the source for 100 milliseconds, with the drain being allowed to float. In contrast, programming (adding electrons to the gate) is achieved by applying a negative 8.5 volt to the substrate for 5 microseconds, zero volts to the drain and control gate with the source floating. The bulk charging operation can just as easily be done on the source side rather than the drain side in a case where the cell is provided in a P well by applying −8.5 volts to the P well for 5 microseconds, 0 volts to the source and control gate with the drain being allowed to float.

Yet another structure and method for programming a cell is detailed in co-pending U.S. pat. application Ser. No. 08/871,589, inventors Hao Fang, et al., filed July 24,1998 and assigned to the assignee of the present application. FIGS. 1A and 1B of the Fang, et al. application are reproduced herein as FIGS. 2A and 2B, and FIGS. 2A and 2B of the Fang application are reproduced as FIGS. 3A and 3B of the present application. The Fang, et al. application uses the programming method disclosed in Haddad, et al. to form a high density, low program/erase voltage and current, and fast byte programming and bulk erase and fast reading speed non-volatile memory structure specifically designed for programmable logic circuit applications.

In Fang, et al. the non-volatile memory cell 10 in FIG. 2A, 2B is formed of a P substrate 12 having embedded therein an N+source region 14, an N-type diffused drain region 16, a floating gate 18 capacitively coupled to the P substrate 12 through a tunnel oxide 20, or other gate dielectric such as nitride oxide; and a control gate 22 coupled capacitively to the floating gate 18 through an oxide/nitride/oxide, or other type of inter polysilicon dielectric, film 24,26. Diffused region 16 is formed of a shallowly diffused but heavily doped N-type junction, while source region 14 is formed of a deeply diffused but lightly doped N junction. The relatively thin gate dielectric 20 (an oxide of 60 to 150 Å in thickness) is interposed between top surface of substrate 12 and conductor polysilicon floating gate 18. Control gate 22 is supported above the floating gate by the inter-poly dielectric layer 24,26. Avalanche program and erase bias configurations of the memory cell of the Fang, et al. application are shown in FIGS. 3A and 3B, respectively.

Program and erase operations are illustrated in FIGS. 3A and 3B. To program the cell, electron injection is effected from the drain side. In this case, programming operation is accomplished by applying +3 volts on the drain and −6 volts on the P substrate so as to shift upwardly the threshold voltage $V_t$ by 4 volts in approximately 0.002 seconds. To erase, holes are injected from the drain side by applying +6.5 volts on the drain and −3 volts on the P substrate so as to shift down with the voltage threshold $V_t$ by 4 volts. Utilizing the substrate bias configuration suppresses hot hole injection due to the fact that the location of the high field is away from the oxide interface, the magnitude of the maximum field strength is reduced by more than 50%, and the vertical field does not favor hole injection.

FIGS. 4A and 4B show FIGS. 10A and 10B of the Fang, et al. application which teach a single polysilicon layer embodiment of the Fang, et al. cell. In such an embodiment, the control gate is replaced with a diffusion region. The control gate can be switched between 0 volts and $V_{cc}$ to select and de-select the cell during the read period and between $V_{jb}$ and 0 volts to program and erase the cells as set forth above. A select transistor is added at the source side to enable a fast read of the memory cell. In this operation, the gate of the added select transistor is set at less than or equal to zero volts during program and erasing and at $V_{cc}$ with $V_d$ less than or equal to $V_{cc}$ and $V_{dm}$ 0 volts via turning on the memory cell for the read period. ($V_d$ is the drain voltage for the select transistor and $V_{dm}$ is the drain voltage for the memory transistor.) Cell size is decreased in comparison to conventional single poly memory cells for programmable logic devices. The bias configurations for the single poly memory cell are disclosed in FIG. 4B.

Generally, arrays of such individual memory cells are formed on a single substrate and combined with sense and read circuitry, and connected by row-wise and column-wise conductive regions or metallic conductors to allow for array wide bulk program and erase as well as selected bit programming.

Each of the aforementioned configurations presents advantages and disadvantages in use in particular applications. Nevertheless, improvements in both the structure of individual cells and the manner in which they are connected together will result in more reliable, stable, faster, and lower power devices which can be programmed and erased at lower voltages.

SUMMARY OF THE INVENTION

In one aspect, the invention, roughly described, comprises a method of creating a reverse breakdown condition in an array of memory cells arranged in columns and rows in the array. The method comprises the steps of applying a first voltage on a first column connection coupling a first column of said cells, and a second voltage on a second column connection coupling a second column of said cells; and applying a third voltage on a first row connection coupling a first row of said cells, and applying said second voltage on a second row connection coupling a second row of said cells. In this aspect, the difference between the first voltage and the third voltage creates said reverse breakdown condition in at least one cell occupying said first column and first row.

In a further aspect, each cell includes a floating gate and the method of the invention includes the step of programming one of said cells by coupling a control voltage to each floating gate.

In yet another aspect of the invention, a memory array structure is provided. The structure includes a substrate having formed therein at least an Nth or Mth row-wise oriented well, each well isolated from adjacent ones of said wells. Also provided are at least an Nth and Mth word bit line formed by an Nth and Mth impurity regions in said substrate and at least an Nth and Mth array control gate lines. A plurality of memory cells, each cell formed in at least said Nth or Mth row-wise well, is further provided. Each cell comprises a drain, a floating gate, a drain connection one of said Nth or Mth word bit line (WBL), and a substrate well connection to one of said Nth or Mth wells, and a control gate connection to one of said Nth or Mth array control gate lines(ACG).

BRIEF DESCRIPTION OF THE DRAWINGS

The invention will be described with respect to the particular embodiments thereof. Other objects, features, and advantages of the invention will become apparent with reference to the specification and drawings in which:

FIG. 2A is a schematic diagram of the non-volatile memory cell of the prior art.

FIG. 2B shows a cross-sectional view of a non-volatile memory cell in accordance with the prior art.

FIGS. 3A and 3B, respectively, show avalanche program and erase bias configurations of a memory cell in accordance with the prior art.

FIG. 4B is a table showing the voltages utilized in accordance with the single poly memory cell shown in FIG. 4A.

DETAILED DESCRIPTION

A novel method for programming and erasing an array of cells, and a novel cell matrix structure, is hereinafter described with reference to the accompanying drawings.

In the following description, numerous details, for example specific materials process steps, etc., are set forth in order to provide a thorough understanding of the invention. It will be readily understood, however, to one of average skill in the art that specific details need not be employed to practice the present invention. Moreover, specific details of particular processes or structures may not be specifically presented in order to not unduly obscure the invention where such details would be readily apparent to one of average skill in the art. Those having ordinary skill in the art and access to the teachings described herein will recognize additional modifications and applications and embodiments within the scope of the present invention.

A First Avalanche/Zener Breakdown Cell

Figure 1B:
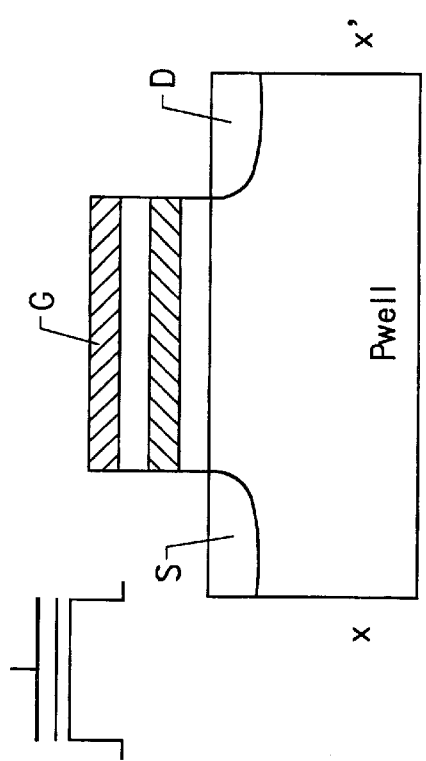
FIGS. 1B and 1C are cross-sections of a prior art reverse breakdown cell, and the Zener breakdown cell shown in FIG. 1A, respectively.
Figure 1C:
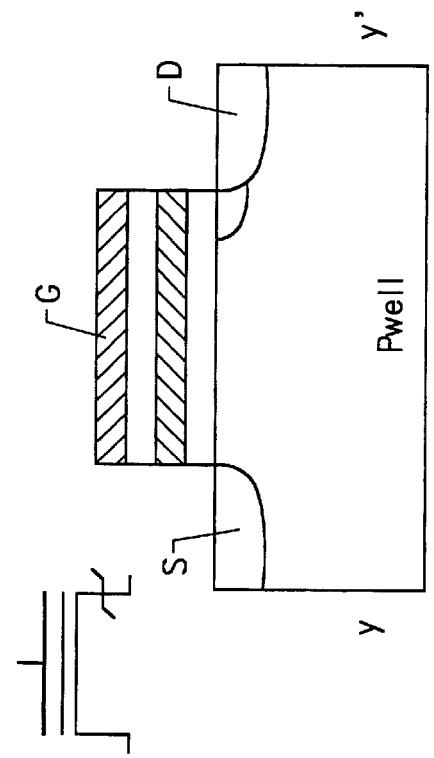
Figure 1A:
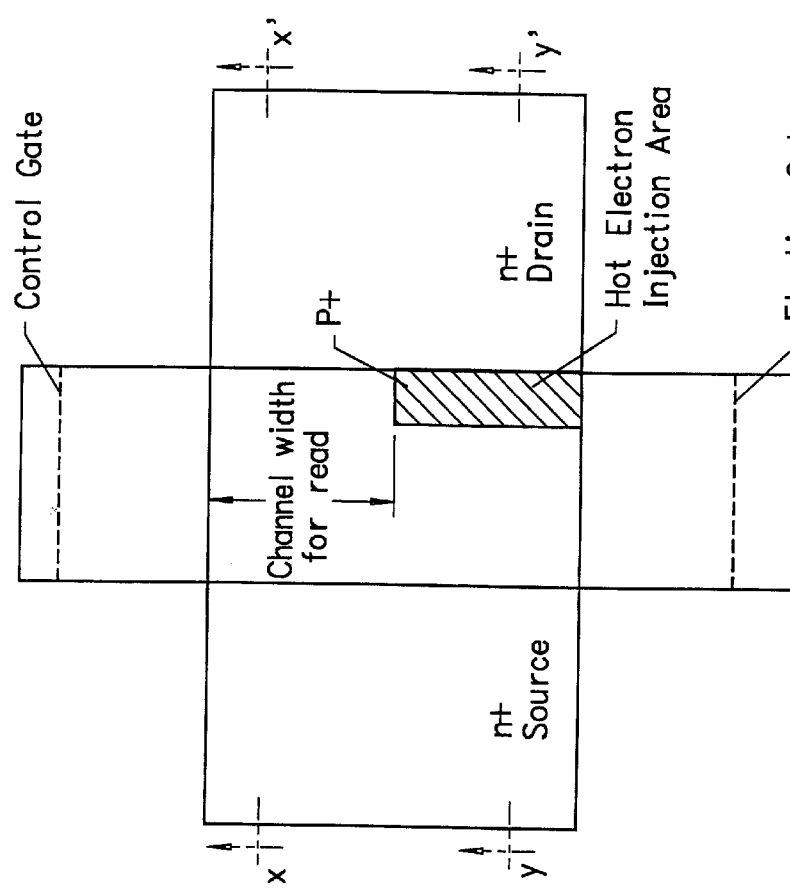
FIG. 1A is a plan view of a Zener breakdown based flash EEPROM cell.
Figure 4A:
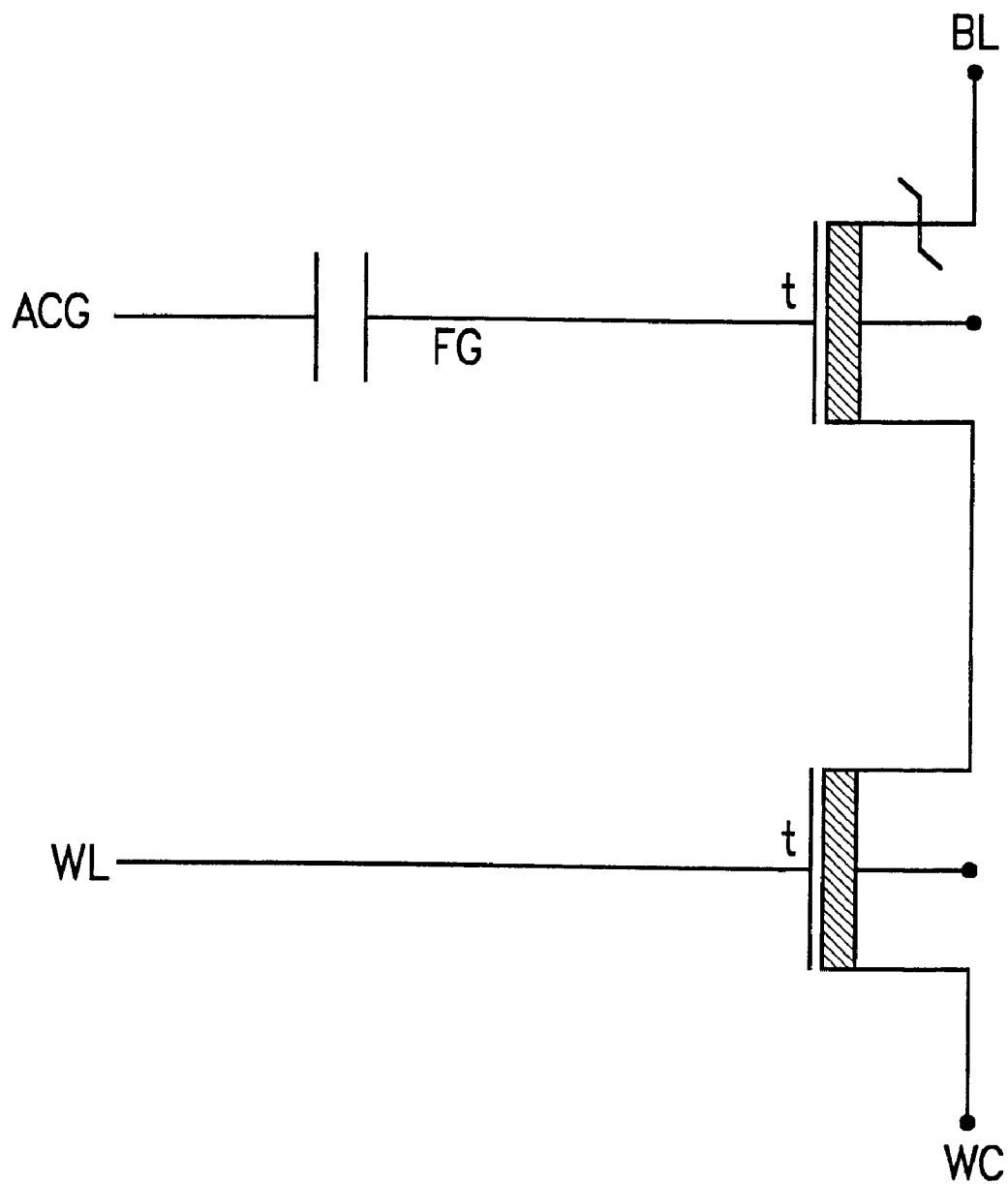
FIG. 4A is a schematic diagram of a single poly memory cell in accordance with the prior art.
Figure 5:
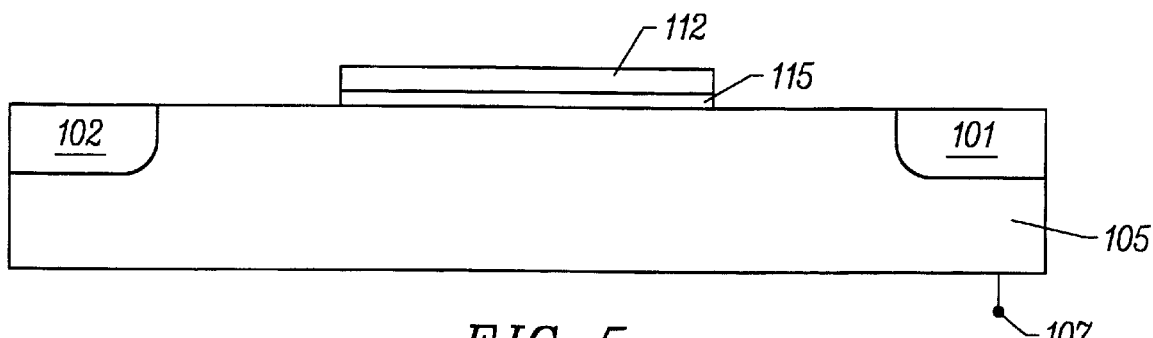
FIGS. 5–7 are cross-sections of a semi-conductor substrate and a non-volatile memory cell formed in accordance with the present invention.
Figure 6:
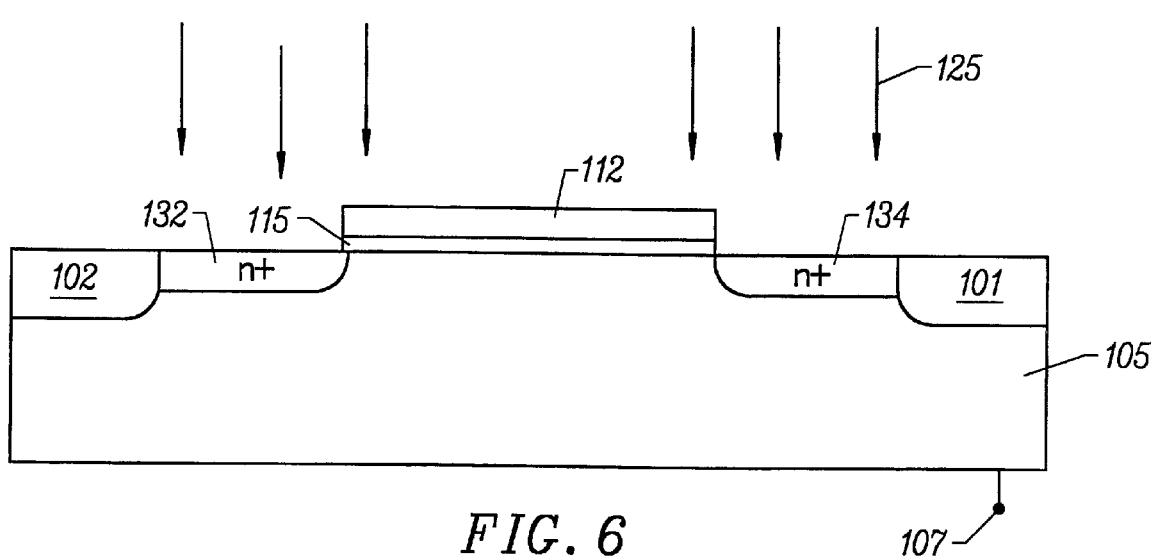
Figure 7:
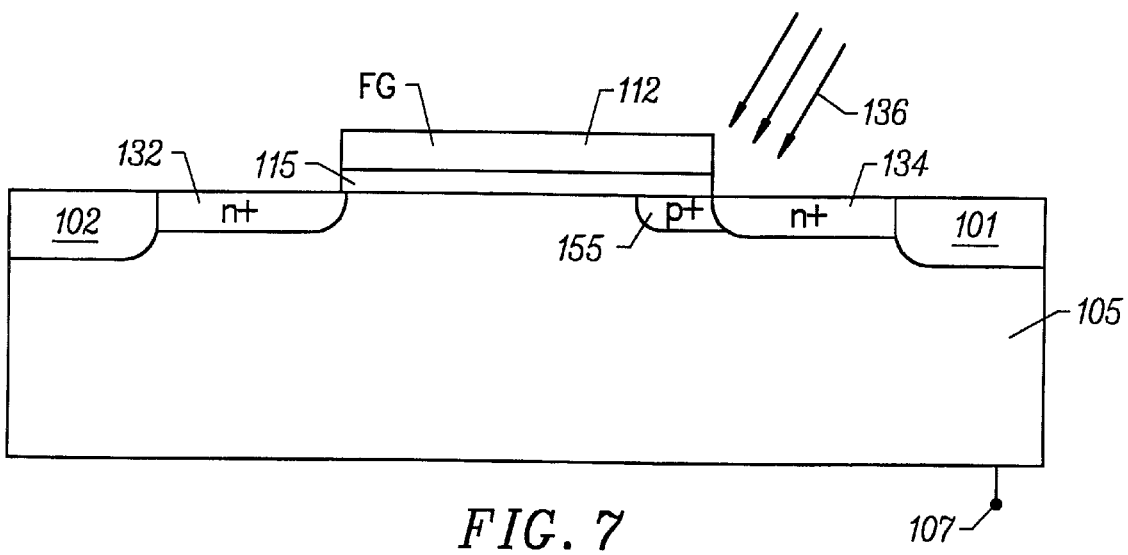

A first non-volatile memory cell structure and a method for manufacturing the structure are shown and described with respect to FIGS. 5–7. FIGS. 5–7 show an exemplary series of steps in the formation of a first embodiment of an avalanche/Zener gate structure suitable for use with the nonvolatile technologies disclosed herein.

FIG. 5 shows a substrate 105 having formed therein field oxidation regions 101 and 102, a gate oxide 115, and a floating gate 112, provided on the gate oxide 115. In one embodiment, substrate 105 may be a p-type substrate having a background doping concentration of about $1 \times 10^{15} – 1 \times 10^{17}$ cm$^{-3}$. Field oxidation regions 101 and 102 represent device isolation structures formed in accordance with well known techniques such as LOCOS, trench isolation, shallow trench isolation and various equivalent alternatives. The shape of the isolation depicted in the figures of the present disclosure is not intended to limit the nature of the type of isolation used herein.

Gate oxide 115 and floating gate 112 are formed in accordance with conventional techniques by, for example, forming a thermal oxide on the surface of substrate 105, depositing a polysilicon layer on top of the gate oxide, and etching the gate oxide and polysilicon layers to form a gate stack comprising oxide 115 and floating gate 112. Various alternative parameters are suitable for growing the gate oxide layer and are well within the knowledge of one of average skill in the art. Likewise, numerous techniques for forming the floating gate layer may be used, including, but not limited to depositing polysilicon by chemical vapor deposition or sputtering and annealing techniques well known to one of average skill in the art. Etching of the polysilicon and gate oxide layers may be performed by any number of suitable wet or dry directional etch step in accordance with well known techniques.

Subsequent to formation of the gate stack, an impurity implant 125 of a dopant having a conductivity type opposite to that of the substrate (arsenic or phosphorus, for example) is performed to form self-aligned first active region 132 and second active region 134 in P-type substrate 105. Typical junction depths of 0.1 µm to 0.5 µm and doping concentration of about $5 \times 10^{18}$ to $1 \times 10^{21}$ cm$^{-3}$ are suitable. Substrate 105 may optionally have a connection 107 to allow for biasing the substrate.

Following implantation of the active regions 132, 134, a Large Angle Tilt Implant (LATI) is utilized to form a P+region 155 adjacent to region 134. The P+implant extends a portion of the width of the channel region, from a position adjacent to region 134 and improves generation of hot electrons for programming. Typically an implant of boron at an energy of 30 to 200 KeV, to a depth as great as 0.1 to 0.4 µm in a concentration of about $1 \times 10^{18}$ to $1 \times 10^{20}$ cm$^{-3}$.

Such a configuration provides the ability to utilize reverse breakdown voltages in a range of 3 V to 10 V in order to generate energetic hot electrons independent of the channel length of the device. It should be recognized with reference to Ranaweera, et al., that the breakdown characteristics of the various P+N+junctions varies with the concentration of the P+region.

However, it will be recognized that the method of the present invention greatly simplifies the manufacture of an avalanche/Zener floating gate device over the elementary teachings provided in Ranaweera, et al. In the present invention, the LATI implant allows for a great degree of freedom in the placement of the implant, the dopant concentration, and the junction depth of the implant in the cell structure shown in FIG. 7. Yet another advantage provided is greater flexibility in the device formation process flow sequence.

Using the large angled tilt implant (LATI), the P+region may be provided at junction depths as great as 0.1 to 0.4 µm, below the surface of substrate 100. This allows for greater control in positioning the P+region below floating gate 112 and by adjusting the dopant concentration, and hence the reverse breakdown voltage of the overall device. Typically, the angle of the implant relative to a plane formed by the surface of the substrate is in a range of about 20° to 80°.

Exemplary operational characteristics for the device shown in FIG. 7 are given as follows: to add electrons to floating gate FG, the substrate is biased to 0 V, first region 132 is floating, second region 134 is at, for example, 8 V and the FG is coupled to a positive voltage from a control gate (not shown) larger than junction breakdown, such as 8 V. To remove electrons from FG, the substrate is biased to 0 V, first region 132 is floating, second region 134 is at 8 V and FG is at a low voltage coupled from a control gate (not shown) of about 0 V. It should be understood that either adding electrons (or removing holes), or removing electrons (or adding holes) can constitute a "program" or "erase" operation, as such "program" or "erase" operation is defined by the context of the overall device in which the non-volatile memory cell is used.

It should be recognized that the method and cell described with reference to FIGS. 5–7 may be utilized with any number of coupling arrangements in any number of matrix arrangements shown herein or in the prior art. It should be further recognized that the method of the present invention may be utilized to construct a non-volatile device wherein the operating parameters vary from the exemplary embodiment set forth above.

In this aspect, the method of forming a memory cell improves substantially over prior art conventional techniques which are taught as being used in Ranaweera et al. In particular, the depth and concentration of the implant can be tailored to the particular device before or after formation of the gate stack, thereby simplifying device manufacture by eliminating at least the spacer formation steps particularly detailed in Ranaweera, et al. as necessary to prevent counter-doping the P+region when implanting the active regions.

A Double Sided Pocket Implant EEPROM Cell

Figure 8A:
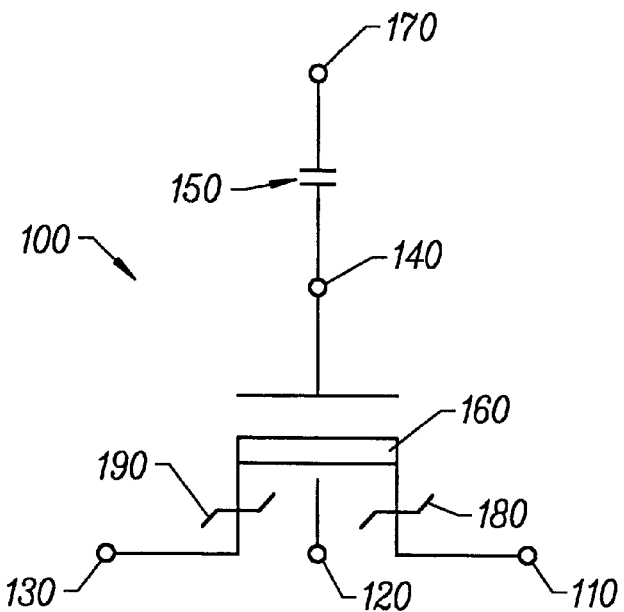
FIG. 8A is a schematic diagram of a further embodiment of a non-volatile memory cell structure of the present invention.
Figure 8B:
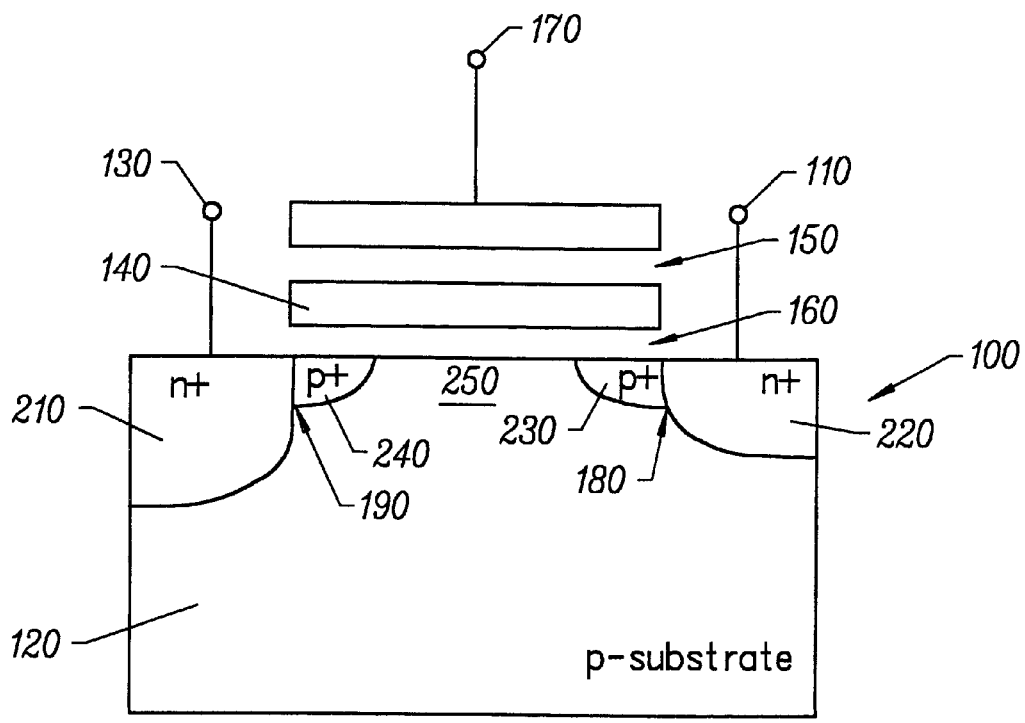
FIG. 8B is a cross-section of the embodiment of a non-volatile memory cell of FIG. 8A.

A novel EEPROM cell formed and programmed in accordance with an alternative embodiment of the present invention is shown in FIG. 8A and 8B.

In this aspect, the present invention is a nonvolatile memory cell that is programmed and erased using hot electrons or hot holes generated by Zener/avalanche breakdown over different regions of the cell oxide. FIG. 8A is a schematic diagram of a memory cell 100 according to the present invention. It will be recognized that although the following description describes formation in a P-type substrate, formation in an N-well is likewise contemplated. Memory cell 100 comprises a P-substrate 120 having formed therein a first program region 130, a second program region 110, a floating gate 140 insulated from and capacitively coupled to P-substrate 120 through an oxide layer 160, and a control gate 170 insulated from and capacitively coupled to floating gate 140 through a dielectric film 150. Depending on the control gate 170 bias voltage, hot electrons or hot holes generated by the Zener/avalanche breakdown of two P+N+junctions erase or program memory cell 100.

FIG. 8B illustrates a cross-sectional view of memory cell 100 according to the present invention. Substrate 120 has formed therein a first active region 110, a second active region 130, P+implant region 230, and P+implant region 240.

Program region 110 consists of a heavily doped ($>10^{17} cm^{-3}$) boron implanted P+region 230, contiguous a shallowly diffused, heavily doped (approximately $1 \times 10^{19} cm^{-3}$) N+region 220. By heavily doping P+region 230, the junction breakdown voltage $V_{pp}$ (essentially the program/erase voltage) is reduced from about 12 V to 6–8 V.

A reduction in $V_{pp}$ reduces the magnitude of the electric field across the channel of the transistor. This, in turn, reduces the number of electrons that are able to acquire the requisite energy to be injected onto oxide layer 160 by Fowler-Nordheim tunneling. (It is this tunneling which creates the carrier traps which cause reliability problems over time.) Because it is this hole trapping which occurs in oxide layer 160 which contributes to long-term device degradation, reducing $V_{pp}$ according to the present invention improves device reliability and enhances data retention.

Program region 130 consists of a heavily doped [($>10^{17} cm^{-3}$)] boron implanted P+region 240, contiguous to a heavily doped [$>10^{19} cm^{-3}$] N+region 210. The N+region 210 reduces junction capacitance and improves the speed of the path used to read data from memory cell 100.

A channel region 250 in substrate 120 separates P+region 230 from region 240. Floating gate 140 is formed over and capacitively coupled to substrate 120 through oxide layer 160. Oxide layer 160 also insulates floating gate 140 from substrate 120. Oxide layer 160 is typically 60 Å-150 Å thick and is thermally grown or deposited by any of a number of well-known conventional processes, including low pressure chemical vapor deposition (LPCVD). Similarly, control gate 170 is formed over and capacitively coupled to floating gate 140 through a dielectric film 150 such as SiO$_2$. Dielectric film 150 can also be thermally grown or deposited by LPCVD.

According to the present invention, hot carriers generated by Zener/avalanche breakdown are employed to program and erase memory cell 100. Memory cell 100 is erased by reverse biasing the P+N+junction 180 formed by P+region 230 and N+region 220. P+N+junction 180 is reverse biased by applying 8V to region 110 and 0 V to substrate 120. In addition, a potential from, for example, a control gate (not shown) is applied to the floating gate 140 (of, for example, 8 V) and when the floating gate potential becomes greater than that of substrate 120, the hot electrons generated in breakdown mode are "injected" into floating gate 140 through oxide layer 160. The resulting net negative voltage on floating gate 140 erases memory cell 100.

Memory cell 100 is programmed by reverse biasing the P+N+junction 190 formed by P+region 240 and N+region 210. P+N+junction 190 is reverse biased by applying 8 V to region 130 and 0 V to substrate 120. A low or zero voltage is applied to a control gate (not shown) so that the floating gate potential becomes lower than the substrate and hot holes are injected into floating gate FG through oxide layer 160. The resulting net positive voltage on floating gate 140 programs memory cell 100.

In keeping with the goal to constantly improve device reliability and enhance data retention, memory cell 100 utilizes hot carrier injection to program and erase through different areas of oxide layer 160. This distinction over the prior art is important since carrier traps created by Fowler-Nordheim tunneling in the prior art generally occur in the same area of oxide layer 160 and can, over time, reduce the reliability of the device.

Such surface damage can degrade long-term cell performance by reducing the cell's threshold voltage, reducing the cell's transconductance, and lowering injection efficiency during program operations. Moreover, such surface damage can interfere with current flow through channel region 250 during read operations. Such surface damage can decrease long-term cell reliability and negatively impact data retention.

Cell 100 minimizes this surface damage attributable to repeated injections of hot carriers into the floating gate 140, by programming (i.e., inject hot holes) and erasing (i.e., inject hot electrons) through two different areas of the oxide layer 160. In so doing, the memory cell 100 according to the present invention increases long-term cell reliability and enhances data retention.

A Non-Volatile Cell Structure Positioned Outside The Read Path

As discussed herein, non-volatile memory cells are typically utilized with accompanying circuitry in cell structures. Such circuitry includes means for controlling voltages applied to the respective terminals of the floating gate device, and for reading the state of the device after it is programmed.

In accordance with the present invention, FIGS. 9–12 show various embodiments of avalanche/Zener floating gate devices coupled in EEPROM cell structures which include accompanying control circuitry. In a unique feature of this aspect of the present invention, the reverse breakdown, electron injection element is provided outside the read path of the cell structure, thereby allowing greater control of the characteristics of the non-volatile memory device during manufacture.

Figure 9:
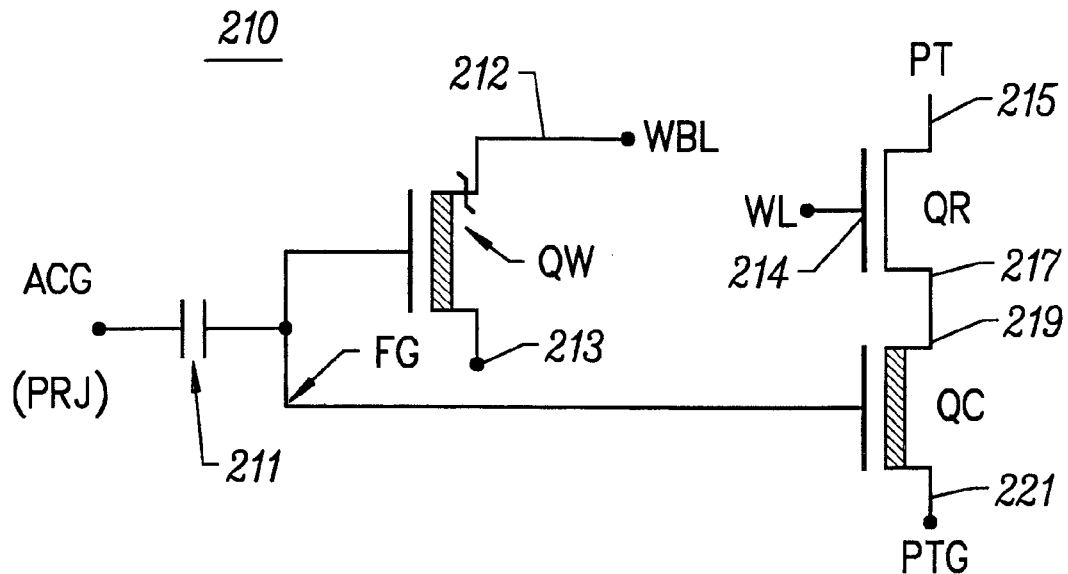
FIG. 9 is a schematic diagram of a memory cell constructed in accordance with one embodiment of the present invention.
Figure 10:
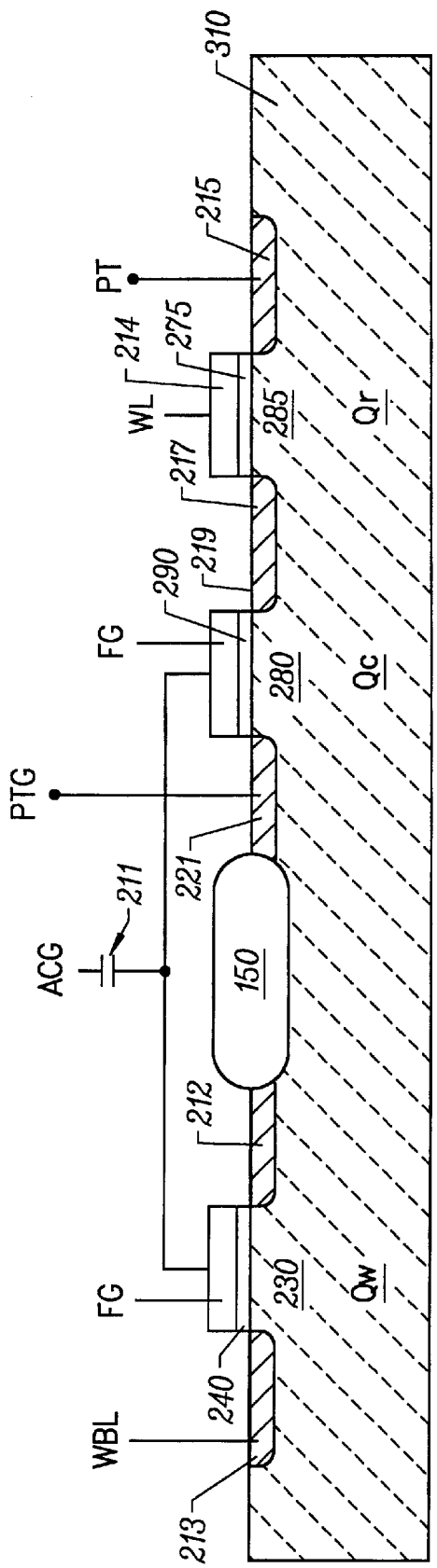
FIG. 10 is a cross-sectional diagram of a memory cell suitable for use with the embodiment of FIG. 9.

FIG. 9 shows a schematic diagram of a first embodiment of a nonvolatile memory cell structure 210 formed in accordance with one aspect of the present invention. FIG. 10 is a cross section of a first embodiment of the EEPROM cell structure of FIG. 9.

Structure 210 includes an (array) control gate ACG, floating gate FG, avalanche/Zener program element $Q_w$, a read transistor $Q_r$, and a sense transistor $Q_c$. The control gate ACG is used to accelerate hot electrons or hot holes selectively to or from the floating gate by capacitively coupling a field across the oxide that separates the avalanche element from the floating gate.

As shown in FIGS. 9 and 10, sense transistor $Q_c$ and avalanche element $Q_w$ share floating gate FG. Floating gate FG is capacitively coupled to array control gate (ACG) voltage via capacitor 211. Avalanche/Zener program element $Q_w$ shares floating gate FG with sense transistor $Q_c$, and includes a first active region 212 and second active region 213.

Sense transistor $Q_c$ shares its drain 219 with source 217 of read transistor $Q_r$. Gate 214 of read transistor $Q_r$ is connected to word line WL. The drain of read transistor $Q_r$ is connected to a read signal select (product term) PT, while the source of sense transistor $Q_c$ is connected to sense signal (product term ground) PTG.

It should be recognized that avalanche/Zener element $Q_w$ can have a structure similar to that set forth in Ranaweera, et al., and/or co-pending U.S. patent application Ser. No. 08/871,589 by Hao Fang, et al. or those set forth in U.S. Pat. No. 4,491,657, or those embodiments set forth herein above in addition to a number of other methods of forming junctions.

FIG. 10 shows an exemplary cross-section of the embodiment of the EEPROM cell 210 as formed on a semiconductor substrate 310. Silicon substrate 310 has a first conductivity type such as a P-type conductivity. The EEPROM cell 210 has three separate elements formed in the semiconductor substrate 310, namely, an avalanche/Zener element $Q_w$, a sense transistor $Q_c$ and a read transistor $Q_r$. An avalanche/Zener element $Q_w$ is electrically separated from the sense transistor $Q_c$ by a first insulated region 150, e.g. silicon dioxide, also formed in the semiconductor substrate 310.

Avalanche/Zener element $Q_w$ has first impurity region 213 and a second impurity region 212, all formed within a substrate 310 with a channel 230 positioned there between. Overlying the channel 230 is an oxide layer 240. The oxide layer 240 is typically composed of an insulating material, such as silicon dioxide, and has a thickness of approximately 80 to 150 angstroms. Oxide layer 240 may be deposited or grown (using conventional oxide deposition techniques) in a single process step.

Sense transistor $Q_c$ has a source 221 and a drain 219 formed in the semiconductor substrate 310. A sense channel 280 is formed between source 221 and drain 219. The conductivity of the source 221 and the drain 219 is of the second conductivity type, for example, an N+conductivity type. Overlying the channel 280 is an oxide layer 290 having an approximate thickness of 80 angstroms. As earlier described, the sense gate oxide layer 290 may also be simultaneously formed with the oxide layer 240. Depending on the mode of sense transistor $Q_c$ (depletion or enhancement mode), the relevant voltages for operating the EEPROM cell 210 are adjusted. The sense transistor $Q_c$ is, in one embodiment, a depletion mode transistor, as is commonly understood in the industry. In a further embodiment, the sense transistor $Q_c$ is an enhancement mode transistor (also as commonly known in the industry).

The read transistor $Q_r$ shares diffusion region 219 with the sense transistor $Q_c$; hence diffusion region 219 acts as the read transistor source and sense transistor drain. The read transistor $Q_r$ also has a drain 215 that has the second conductivity type, e.g. an N+conductivity type. A channel 285 is positioned between source 217 and drain 215. Overlying the read channel is an oxide 275 layer that is composed of an insulating material, such a silicon dioxide, and has an approximate thickness of 25–150 angstroms. The read drain oxide layer 275 may be formed in the same step as the oxide layer 290, or in a separate step. Between the read source 217 and the read drain 215 is a read channel 285. A read gate 214 overlies the read oxide layer 275 and is composed of a conducting material, such as a polycrystalline silicon material.

Floating gate FG overlies the program element oxide layer 240 and sense oxide layer 290. Floating gate FG is also formed of a conducting material, such as a polycrystalline silicon material.

Figure 11:
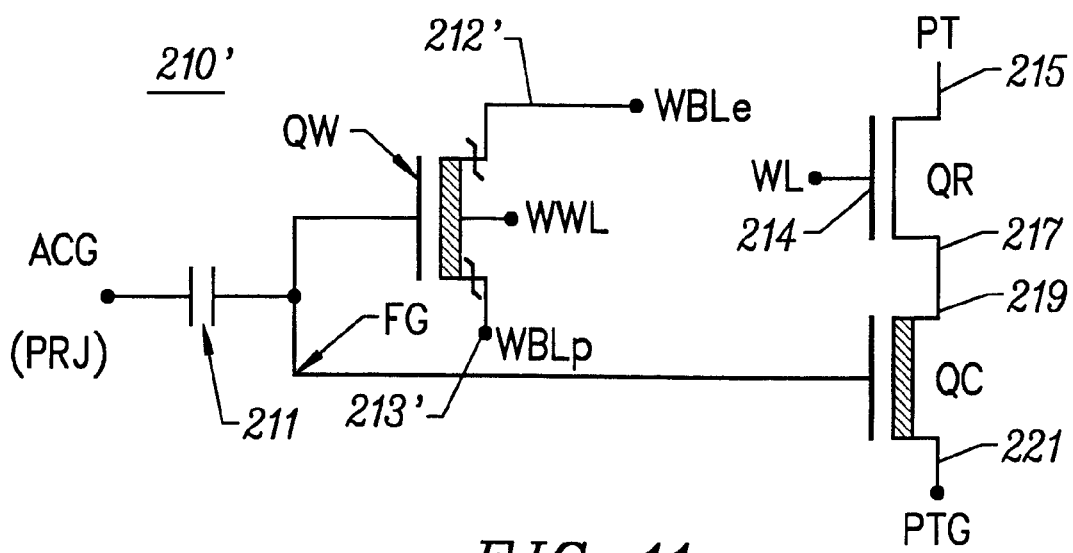
FIG. 11 is a schematic diagram of a memory cell constructed in accordance with a second embodiment of the present invention.
Figure 12:
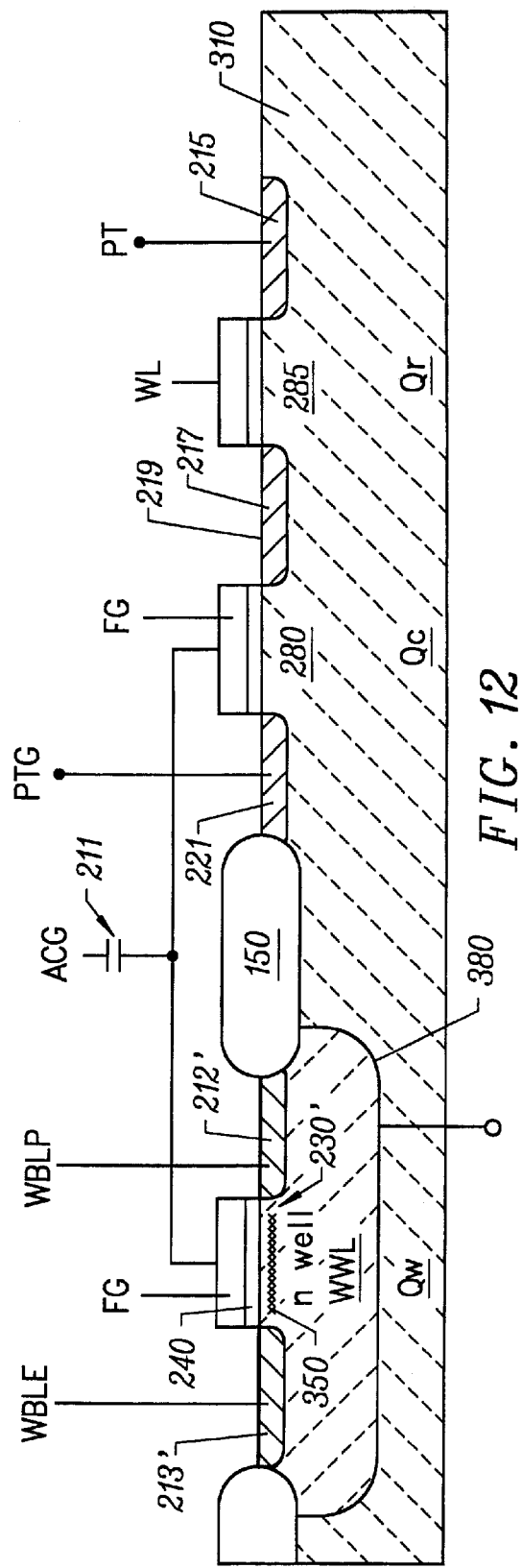
FIG. 12 is a cross-sectional diagram of a memory cell suitable for use with the embodiment of FIG. 11.

FIGS. 11 and 12 are a schematic diagram and a cross section, respectively, of an alternative embodiment of the invention set forth above with respect to FIGS. 9 and 10. In this embodiment, a dual side (program/erase) program transistor $Q_w'$ is utilized and is formed in an n well region in substrate 310 in order to allow for easier coupling of devices in the array and provide an alternative mechanism for charging and discharging the floating gate FG.

As shown in FIG. 12, well 380 has a second conductivity type opposite the first conductivity type, such as an N conductivity type. In contrast, the impurity regions 213' and 212' have the first conductivity type, e.g. a P type conductivity. An N+region in well 380 provides appropriate electrical contact to metal lines in the EEPROM cell 210, such as word write line (WWL).

Also illustrated in FIG. 12 is a further unique aspect of the present invention enabled by the configuration set forth in FIGS. 9–12, that of a selective channel implant region 350 implanted in channel 230' which allows one to tailor the reverse breakdown voltage of the cell to suit the particular application of the EEPROM 210.

The elements $Q_w$, $Q_c$ and $Q_r$ of EEPROM 210 are electrically coupled to certain electrical lines and gates in order to operate and control the functions of the EEPROM cell 210. As shown in FIG. 12, $WBL_e$ is electrically coupled to the program region 213', $WBL_p$ coupled to region 212', and WWL to N+well 380. Both configurations (210, 210') share an additional capacitor 211 used to capacitively couple voltage (ACG) onto the floating gate (FG). An array control gate (ACG) is capacitively coupled to the floating gate FG. A product term ground (PTG) is electrically coupled to the sense source 221 of the sense transistor $Q_c$. A word line read (WL) is electrically coupled to the read gate 214 of the read transistor Qr and a Product Term (PT) is electrically coupled to the read drain 215. A significant advantage of the N-well configuration shown in FIG. 12 is the isolation of cell $Q_w$ with respect to other cells in an array. Normally, highly uniform control over programming voltages must be maintained in order to avoid program disturb. Isolation of each program element in an N-well reduces the need for this highly uniform control due to the respective isolation of each cell.

Typical operating voltages for the foregoing lines are given in Table 1:

TABLE 1

|  | WBL | WWL | ACG | PT | PTG | WL |
|---|---|---|---|---|---|---|
| Erase (NMOS) | 6v | 0v | 8v | Float | 6v | Vcc |
| Program (NMOS) | 6v | 0v | 0v | Float | 0v | 0V |
| Erase (PMOS) | 0v | 6v | 8v | Float | 6v | Vcc |
| Program (PMOS) | 0v | 6v | 0v | Float | 0v | 0V |

In contrast with the cell disclosed in U.S. Pat. No. 4,924,278, the cell of the present invention utilizes the avalanche/Zener injection capacities of the aforementioned prior art to place electrons on the floating gate in accordance with the techniques described therein.

Because of the separate formations for each of the elements, the diode doping gradient for transistor $Q_w$ can be selected to control the avalanche breakdown voltage of cell $Q_w$ and a scaling of the programming voltage below current known levels.

In a further unique aspect of the present invention, thin (80Å) oxides for all floating gate elements may be utilized. Separation of the read path and program elements in accordance with this aspect of the present invention further allows one to use differing oxides for the read and sense elements.

In the devices shown in FIGS. 11–12, separate program and erase path are utilized, hence an active region is for example connected to a write enable line ($WBL_e$) while another active region is connected to the program enable line ($WBL_p$). It should be recognized that the separate program and erase paths shown in FIGS. 11–12 are not required for the present invention, but the employment of this "back-to-back" diode provides advantages in separating the program and erase operations.

It should be recognized that transistor $Q_w'$ could also be formed in an NMOS embodiment, and transistor QW in a PMOS embodiment, without diverging from the scope of the present invention. Moreover, numerous conventional fabrication methods are suitable for adjusting the diode doping gradient of the channel region 350.

AN EEPROM Array and Method for Programming

As noted above, cells of type presented herein are typically provided in an array in which a number of cells are coupled to control conductors in the form of metal or diffused regions in the substrate. Control voltages are applied to these conductors in order to accomplish the goals of the integrated circuit device of which the array is a part.

In a further unique aspect of this invention, a unique array structure, and method for programming cells in the array structure, is provided.

Figure 13:
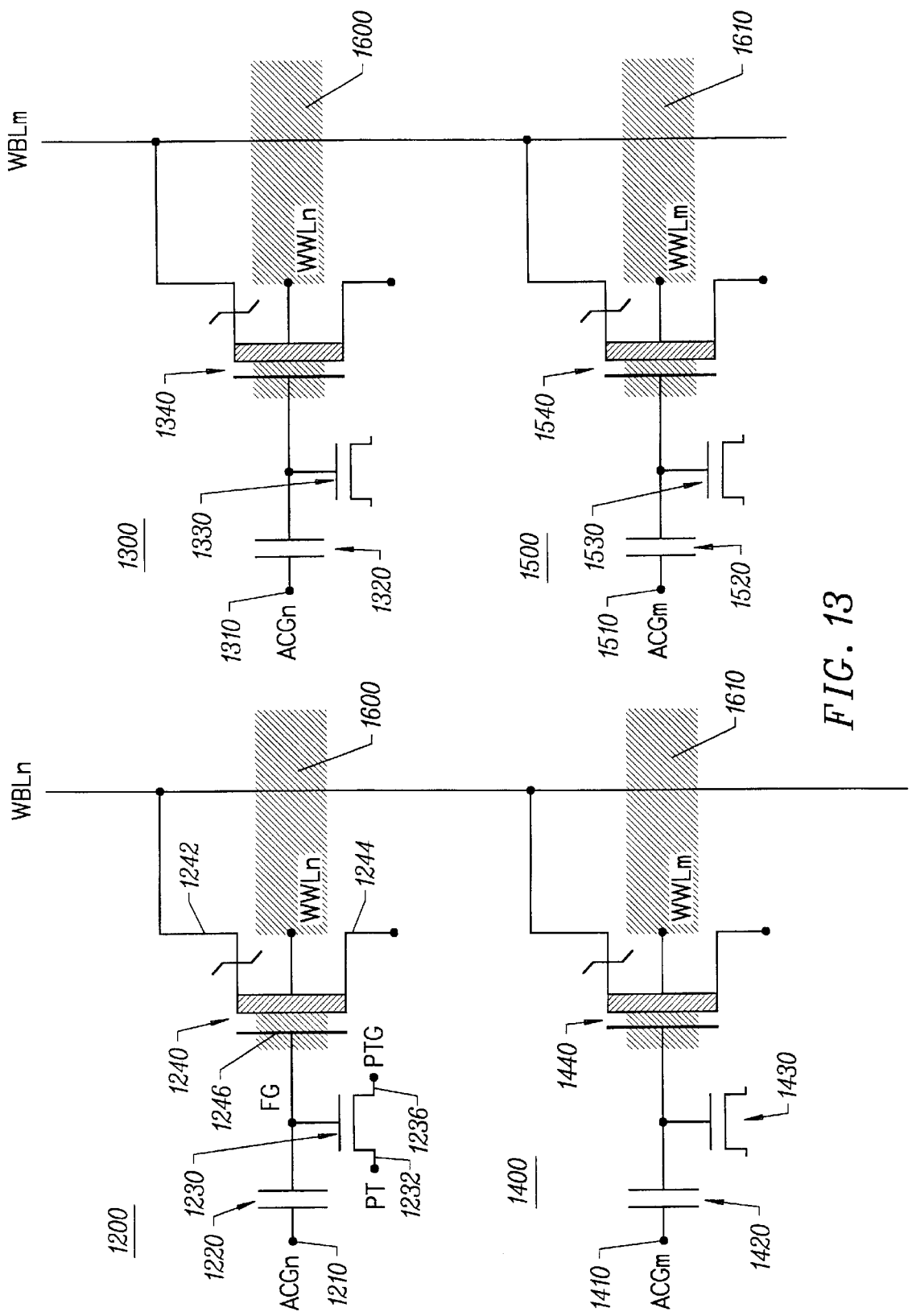
FIG. 13 is a schematic diagram of a 2×2 matrix of memory cells in accordance with the present invention.

FIG. 13 shows a two-by-two matrix 1000 of non-volatile memory cells 1200,1300,1400,1500 in accordance with the present invention. Cell 1200 is exemplary of each cell in the matrix and hence the structure of cells 1300, 1400 and 1500 is not specifically described, but should be readily understood by reference to like designated components designated with reference numerals (13xx,14xx,15xx) similar to those in cell 1200 (12xx). Cells 1200,1300,1400,1500 are hereinafter described with reference to their formation as NMOS transistors in a p-doped substrate. Alternative embodiments of PMOS transistors in aptly formed well regions in the substrate will be readily apparent to one of average skill in the art.

Cell 1200 includes capacitor 1220, a floating gate transistor 1230, and an avalanche/Zener injector diode 1240. It will be understood that diode 1240 (as well as diodes 1340,1440,1540) can have a configuration equivalent to the avalanche/Zener-type nonvolatile memory cells disclosed as set forth herein in the preceding sections, or those discussed in Fang, et al., Haddad, et al., or Ranaweera, et al.

Diode 1240 includes a drain region 1242 coupled to a first program line $(WBL)_n$ and a source region 1244, and floating gate (FG) at region 1246. Nonvolatile floating gate transistor 1230 includes a source 1232 and drain 1236, and floating gate (FG) coupled at point 1234. Floating gate (FG) is coupled in common with the control gate capacitor 1220. Transistor 1230 provides the sense element for circuitry (such as read circuitry, not shown) which is utilized in detecting the state of the cell. The source and drain of transistor 1230 may be coupled to read circuitry and electrical couplings as discussed above, or in any number of other well-known manners.

Cells 1200 and 1300 share a first common array control gate (ACG) connection $ACG_n$ at terminals 1210, 1310, coupled to capacitors 1220, 1320, respectively. Likewise, each avalanche injector diode 1240, 1340, in a novel aspect of the present invention, shares a first common Word Line Connector $WWL_n$.

Figure 14:
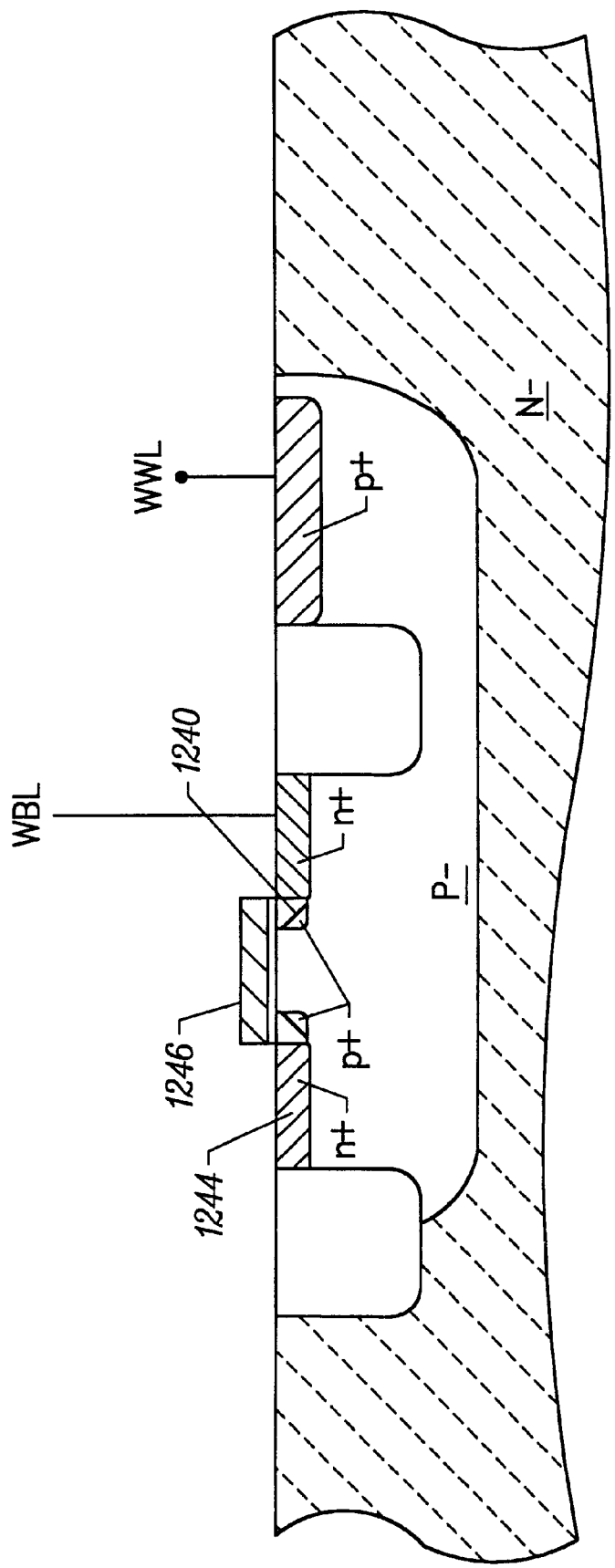
FIG. 14 is a cross-section of the single poly memory cell structure in accordance with the present invention.

A particular single-poly cross-section configuration of the memory array along the $WBL_n$ line is shown in FIG. 14. FIG. 14 shows a cross-section of the polysilicon structure of floating gate (FG), and diffused or implanted conductive lines $WBL_n$ and $WWL_n$ in relation to a memory cell, such as cell 1200.

Each word write line is formed, as shown in FIG. 14, by forming a common P- well region for each row, which is biased by P+word write line $WWL_n$, allowing the substrates of each cell in a row 1240, 1340 to be commonly biased. Likewise, cells 1400 and 1500 share a P- well 1610, and second common word line $WWL_m$, and are connected to a second common control gate connection $ACG_m$. Cells 1200 and 1400 share a first common program line $WBL_n$, and cells 1300 and 1500 share a second common program line $WBL_m$. In each cell, floating gate FG is coupled to the control gate 1210 of diode 1240.

It will be readily recognized that the particular construction of the avalanche cells, and the construction of the floating gate transistors, may be varied in accordance with the principles of the present invention.

Table 2 shows one exemplary application of the voltages applied on the respective conductors in accordance with the present invention:

TABLE 2

|  | $WBL_n$ | $WBL_m$ | $WWL_m$ | $WWL_n$ | $ACG_n$ | $ACG_m$ |
|---|---|---|---|---|---|---|
| PROGRAM | 6v | 3v | 3v | 0v | 8v | 0v |
| ERASE | 6v | 3v | 3v | 0v | 0v | 0v |

So applied, only one cell in the array, in this case cell 1200, will have an avalanche injector diode which is in breakdown mode, while each of the other cells will not be in breakdown mode assuming a breakdown state of 6 V, where six volts are above the avalanche breakdown mode, while three volts are below. Hence, in one embodiment, gated diodes 1240, 1340, 1440, 1540 are only in avalanche breakdown mode when WBL equals approximately six volts and WWL equals approximately zero volts for an individual cell. The selected cell (1200 in this example) may be charged to $+V_e$ or $-V_p$ (and hence erased or programmed) according to the bias on the ACG. Cells 1300 and 1400 have a voltage across their P/N junctions of only 3 volts and hence are not in avalanche or Zener breakdown mode. Cell 1500 has three volts on both $WWL_m$ and $WBL_m$ and hence there is zero voltage across the breakdown region.

It should be understood that any number of cells may be utilized in accordance with the teachings of the present invention. In addition, the foregoing voltages are illustrative only.

The many features and advantages of the present invention will be apparent to one of average skill in the art in view of the illustrative embodiments set forth herein. The present invention has been described herein with respect to particular embodiments for a particular applications. It will be apparent to one of average skill in the art that numerous modifications and adaptations of the present invention may be made in accordance with the invention without departing from the spirit of the scope of the invention as disclosed herein and defined by the following claims.

What is claimed is:

1. A method of creating a reverse breakdown condition in an array of memory cells arranged in columns and rows in the array, comprising:

applying a first voltage on a first column connection coupling a first column of said cells, and a second voltage on a second column connection coupling a second column of said cells; and applying a third voltage on a first row connection coupling a first row of said cells, and applying said second voltage on a second row connection coupling a second row of said cells;

wherein the difference between the first voltage and the third voltage creates said reverse breakdown condition in at least one cell occupying said first column and first row.

2. The method of claim 1 wherein each cell includes a floating gate and the method further includes the step of:

programming one of said cells by coupling a control voltage to each floating gate.

3. A method of programming an array of memory cells arranged in columns and rows in the array, each cell being responsive to a reverse breakdown voltage condition, comprising:

applying a first voltage on a first column connection coupling a first column of said cells, and a second voltage on a second column connection coupling a second column of said cells;

applying a third voltage on a first row connection coupling a first row of said cells, and applying said second voltage on a second row connection coupling a second row of said cells, wherein the difference between the first voltage and the third voltage creates said reverse breakdown condition in at least one cell occupying said first column and first row; and applying a row control voltage to said first row connection and second row connection to program or erase said at least one cell.

4. The method of claim 3 wherein the first voltage is approximately two times the second voltage.

5. The method of claim 3 wherein the first voltage is the reverse voltage breakdown voltage, the second voltage is approximately one-half of the reverse breakdown voltage and the third voltage is zero.

6. The method of claim 5 wherein the first voltage is approximately 6 volts, the second voltage is approximately 3 volts and the third voltage is zero.

7. The method of claim 3 wherein the first voltage is zero, the third voltage is the reverse voltage breakdown condition voltage, and the third voltage is approximately one-half the first voltage.

8. The method of claim 5 wherein the first voltage is approximately 0 volts, the second voltage is approximately 3 volts and the third voltage is 6 volts.

9. A method for programming non-volatile memory cells coupled in an array, comprising:

providing an array including at least four memory cells arranged in a two-by-two format, each cell responsive to a first voltage condition enabling programming of said cell and a second voltage condition to program or erase the enabled cell, the first voltage condition defined by at least a first and a second column conductors, connecting a first and second columns of cells, respectively, and at least a first and a second row conductors, a first and second rows of cells, respectively, and the second voltage condition defined by at least a third and fourth row conductors coupling said first and second rows of cells, respectively;

applying a first voltage to the first column conductor and a second, higher voltage to the second column conductor;

applying a third voltage to the first row conductor and said second voltage to the second row conductor; and applying a fourth control voltage to the third and fourth row conductors.

10. The method of claim 9 wherein the first voltage is approximately two times the second voltage.

11. The method of claim 9 wherein the cells are NMOS cells, and wherein the first voltage is the reverse voltage breakdown voltage, the second voltage is approximately one-half of the reverse breakdown voltage and the third voltage is zero.

12. The method of claim 9 wherein the cells are PMOS cells, and wherein the first voltage is zero, the third voltage is the reverse voltage breakdown condition voltage, and the third voltage is approximately one-half the first voltage.

13. A method for programming non-volatile memory cells coupled in an array, comprising:

providing an array a plurality of cells arranged in at least two columns and at least two rows, each cell including a substrate, a drain, a floating gate, a drain connection to an Nth or Mth word bit line (WBL), a substrate connection to an Nth or Mth word write line (WWL), and a control gate connection to an array control gate line (ACG), applying a first voltage to the Nth WBL and a second, higher voltage to the Mth WBL;

applying a third voltage to the Nth WWL and said second voltage to the Mth WWL; and applying a fourth control voltage to the ACG.

14. A memory array, comprising:

a substrate having formed therein at least an Nth or Mth row-wise oriented well, each well isolated from adjacent ones of said wells;

at least an Nth and Mth word bit line formed by and Nth and Mth impurity regions in said substrate;

at least an Nth and Mth array control gate lines; and a plurality of memory cells, each cell formed in at least said Nth or Mth row-wise well, and comprising a drain, a floating gate, a drain connection one of said Nth or Mth word bit line (WBL), and a substrate well connection to one of said Nth or Mth wells, and a control gate connection to one of said Nth or Mth array control gate lines(ACG).

15. A memory array structure, comprising:

a first cell structure including an injector having a source, drain, control gate, substrate contact, and floating gate, the substrate contact provided in a first conductive region in the substrate;

a second cell structure including an injector having a source, drain, control gate, substrate contact, and floating gate, the substrate contact sharing said first conductive region with the first cell structure, and sharing a floating gate connection with the floating gate of the first cell structure;

a third cell structure including an injector having a source, drain, control gate, substrate contact, and floating gate, the substrate contact provided in a second conductive region in the substrate and having its drain coupled to the drain of the first cell structure; and a fourth cell structure including an injector having a source, drain, control gate, substrate contact, and floating gate, the substrate contact provided in a second conductive region in the substrate, having its drain coupled to the drain of the second cell structure, and sharing a floating gate connection with the floating gate of the first cell structure.

16. A memory array structure comprising:

at least four memory cells arranged in a two-by-two format, each cell responsive to a first voltage condition enabling programming of said cell and a second voltage condition to program or erase the enabled cell, the first voltage condition defined by at least a first and a second column conductors, connecting a first and second columns of cells, respectively, and at least a first and a second row conductors, a first and second rows of cells, respectively, and the second voltage condition defined by at least a third and fourth row conductors coupling said first and second rows of cells, respectively.

17. The array of claim 16 wherein each memory cell comprises:

a floating gate;

an reverse breakdown electron injection element at least partially formed in a first region of a semiconductor substrate operatively coupled to the floating gate; and a sense transistor at least partially formed in a second region of a semiconductor substrate isolated from the first region, operatively coupled to the floating gate.

18. The array as defined in claim 17 wherein each cell further comprises:

a read transistor at least partially formed in the second region of a semiconductor substrate, coupled to the sense transistor.

19. The array as defined in claim 17 wherein the reverse breakdown electron injection element comprises a first and second active regions separated by a first channel region, all formed in the first region of the semiconductor substrate, and said floating gate is positioned over said first channel region.

20. The array as defined in claim 19 wherein the first channel region is a well region comprising said first or second row conductor.

21. The array as defined in claim 20 wherein the first and second active regions comprise a source region and a drain region, respectively, and wherein said source region is a lightly doped impurity region and said drain is a heavily doped impurity region.

22. The array as defined in claim 20 wherein the first and second active regions comprise a source region and a drain region, respectively, and wherein at least one contiguous region formed by an impurity of an opposite conductivity type to that of the source and drain regions is provided adjacent said source or drain region.

23. The array as defined in claim 22 wherein at least one said contiguous region is provided adjacent said source region and said drain region.

24. The array as defined in claim 17 wherein the substrate has a background doping concentration of a first conductivity type;

a well region of a second conductivity type is formed in the first region of the substrate, the first and second active regions comprise a source region and a drain region, respectively, formed by an impurity of said first conductivity type; and said well region comprises said first or second row conductor.

* * * * *